(12) United States Patent
Baldwin et al.

(10) Patent No.: US 9,184,311 B2
(45) Date of Patent: Nov. 10, 2015

(54) CLOUD TRACKING

(75) Inventors: Robert R. Baldwin, Bound Brook, NJ (US); Kevin Collins, Park Ridge, NJ (US)

(73) Assignee: First Solar, Inc., Perrysburg, OH (US)

( * ) Notice: Subject to any disclaimer, the term of this patent is extended or adjusted under 35 U.S.C. 154(b) by 610 days.

(21) Appl. No.: 12/851,460

(22) Filed: Aug. 5, 2010

(65) Prior Publication Data

US 2011/0060475 A1  Mar. 10, 2011

Related U.S. Application Data

(60) Provisional application No. 61/231,599, filed on Aug. 5, 2009.

(51) Int. Cl.
| | |
|---|---|
| *G01W 1/00* | (2006.01) |
| *G06F 19/00* | (2011.01) |
| *G06F 1/28* | (2006.01) |
| *H01L 31/02* | (2006.01) |
| *G01W 1/10* | (2006.01) |
| *G01W 1/12* | (2006.01) |
| *H01L 31/042* | (2014.01) |
| *H01L 31/04* | (2014.01) |
| *G01R 31/40* | (2014.01) |

(52) U.S. Cl.
CPC .......... *H01L 31/02021* (2013.01); *G01W 1/10* (2013.01); *G01W 1/12* (2013.01); *H01L 31/042* (2013.01); *H02S 10/00* (2013.01); *H02S 50/00* (2013.01); *Y02E 10/50* (2013.01); *Y02T 10/84* (2013.01)

(58) Field of Classification Search
CPC .... G01W 1/10; G01W 1/12; H01L 31/02021; H01L 31/042; Y02E 10/50; G01R 21/133; G01D 9/005; G01J 5/08
See application file for complete search history.

(56) References Cited

U.S. PATENT DOCUMENTS

| | | | |
|---|---|---|---|
| 4,355,896 | A | 10/1982 | Laue |
| 4,491,727 | A | 1/1985 | Appelbaum et al. |
| 4,868,379 | A | 9/1989 | West |
| 6,133,990 | A | 10/2000 | Miller et al. |
| 6,490,530 | B1 | 12/2002 | Wyatt |
| 7,414,706 | B2 | 8/2008 | Nichols et al. |
| 2005/0078006 | A1* | 4/2005 | Hutchins et al. ............. 340/561 |
| 2006/0132753 | A1 | 6/2006 | Nichols et al. |
| 2007/0118285 | A1 | 5/2007 | Baryshnikov |
| 2008/0264164 | A1 | 10/2008 | Solheim et al. |
| 2009/0007706 | A1* | 1/2009 | Hitt et al. ........................ 73/866 |
| 2010/0100328 | A1* | 4/2010 | Moore et al. ...................... 702/3 |
| 2010/0198420 | A1* | 8/2010 | Rettger et al. ................ 700/291 |
| 2010/0231045 | A1* | 9/2010 | Collins et al. ................... 307/47 |
| 2011/0163222 | A1* | 7/2011 | Moser ......................... 250/203.4 |

* cited by examiner

*Primary Examiner* — Janet Suglo
*Assistant Examiner* — L. Anderson
(74) *Attorney, Agent, or Firm* — Dickstein Shapiro LLP

(57) ABSTRACT

A cloud tracking system for photovoltaic power plant is disclosed. The cloud tracking system for photovoltaic power plant can include plurality of cloud shadow sensors positioned on the perimeter of the photovoltaic power plant.

25 Claims, 2 Drawing Sheets

CLOUD TRACKING

CLAIM OF PRIORITY

This application claims priority to U.S. Provisional Patent Application No. 61/231,599, filed on Aug. 5, 2009, which is incorporated by reference in its entirety.

TECHNICAL FIELD

This invention relates to a cloud tracking system for photovoltaic power plant.

BACKGROUND

Photovoltaic power plants are becoming practical as grid scale generation facilities capable of producing tens of megawatts as the cost of photovoltaic modules decrease. An increasing number of large plants will be built to satisfy the growing demand for renewable energy capacity. However, photovoltaic plants are intermittent energy producers, and considered to have unpredictable capacity because of intermittent cloud cover.

DETAILED DESCRIPTION

Figure 1:
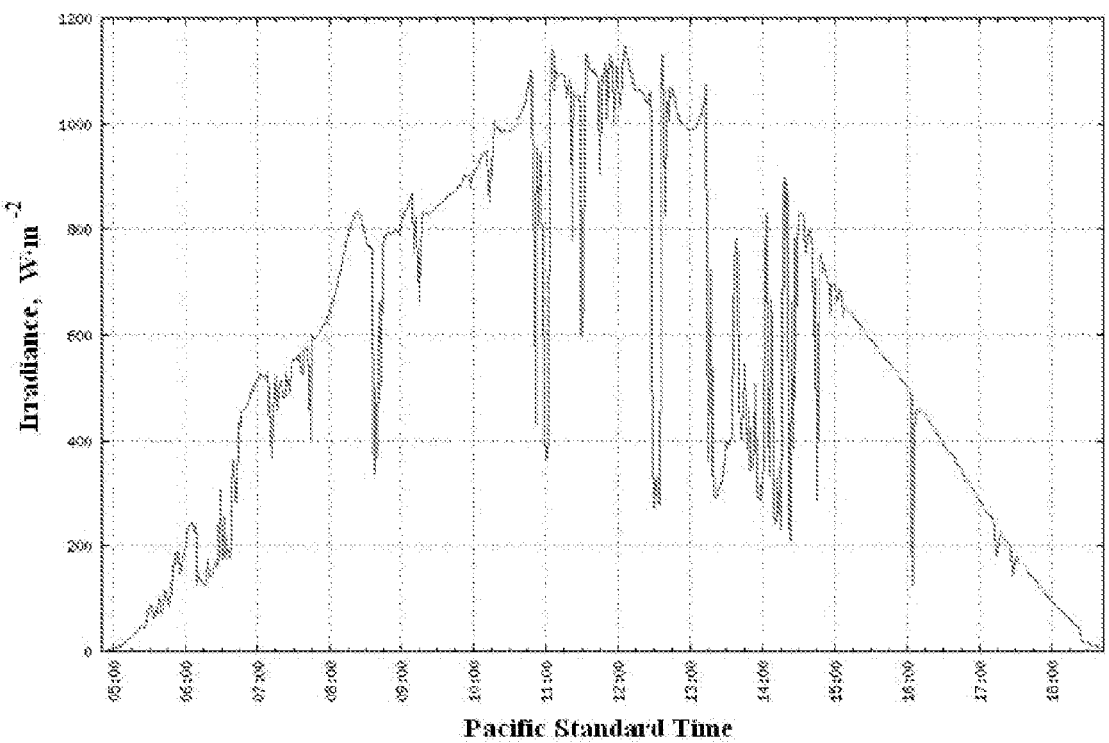
FIG. 1 is a schematic showing short term solar irradiance variability.

Photovoltaics is the field of technology and research related to the application of solar cells for energy by converting sun energy (sunlight, including sun ultra violet radiation) directly into electricity. Due to the growing demand for clean sources of energy and the decreased cost of photovoltaic modules, photovoltaic (PV) power plants are becoming practical as grid scale generation facilities capable of producing tens of megawatts. An increasing number of large plants will be built to satisfy mandates for renewable energy capacity. Penetration levels of PV plants are expected to be significant. Photovoltaic plants are intermittent energy producers, and considered to have unpredictable capacity because of weather conditions. Therefore, the stability of the grid needs to be managed by allocating capacity for load following and frequency regulation with gas turbine generators or other generators that can operate under all conditions of weather. A cloud tracking system for photovoltaic power plant is developed to reduce plant output variability, reducing the normal plant output as variability increases and increasing normal plant output as variability decreases. The result is the plant produces a power output profile that is related to the average variability.

In one aspect, a cloud tracking system for a photovoltaic power plant may include a plurality of cloud shadow sensors positioned on the perimeter of the photovoltaic power plant at a distance that permits early detection of moving clouds, such as various species of cumulus, and a data collecting and process module configured to collect data from the sensors. The cloud shadow sensors may include telemetry to send signals indicating intermittent irradiance changes caused by the incoming clouds. The cloud shadow sensors can be ground based and arranged in at least two concentric rings called the outer detection perimeter and the inner detection perimeter respectively.

The distance of the outer and inner detection perimeters from the photovoltaic power plant can be designed to assure time for photovoltaic plant control response, detection of cloud trajectory, and grid interoperability. The distance of the outer detection perimeter from the photovoltaic power plant can be a definable distance further than the inner detection perimeter that can facilitate cloud speed and trajectory determination. Additional concentric rings may be used to provide additional data for the calculation of cloud trajectory. The spacing between ground sensors on the perimeters and the spacing between the outer detection perimeter and the inner detection perimeter can be designed to assure determination of the speed and trajectory of the incoming clouds. The sensors on the inner detection perimeter can be spaced closer than the sensors on the outer detection perimeter to better detect stray clouds not picked up at the outer detection perimeter. The distance of the detection perimeters from the photovoltaic power plant and the arrangement of ground sensors can be designed to assure determination of the anticipatory action needed to mitigate the effects of intermittent cloud shadows on the photovoltaic power plant.

The cloud tracking system can further include a power plant control system, wherein the control system can initiate ramp down of the photovoltaic plant output power by control of inverters when clouds such as oncoming clouds are detected at the outer detection perimeter, wherein cloud detection can be confirmed and trajectory and speed determined at the inner detection perimeter by comparison to detection position and time elapsed at the outer detection perimeter, wherein the plant control system can initiate the start of the ramp down process based on the speed detected at the inner detection perimeter and the plant control system can initiate power ramp up when cloud shadows have cleared the photovoltaic plant array field and no other oncoming clouds are detected.

The cloud shadow sensors can be positioned in substantially the same plane of the photovoltaic plant array so that the magnitude of solar irradiance deviation can be detected and used by the control system to calculate the amount power control needed. The cloud shadow sensors can also include photodiodes having different photovoltaic characteristics from the photovoltaic power plant. The timing of power ramp down and ramp up can be based on a pre-set ramp rate, wherein the initiation of the power ramp down can be delayed based on the measured cloud speed between the outer and inner detection perimeters. The power plant control module may include an adaptive control algorithm for regulating the rate of change of output power so that the plant output power averaged over a rolling period of time is used to adjust the normal power level of the plant to reduce plant output variability. The data collecting and process module may include a data storage device to generate a seasonal cloud shadowing profile.

In another aspect, a method of tracking cloud for photovoltaic power plant can include positioning a plurality of cloud shadow sensors on the perimeter of the photovoltaic power plant at a distance that permits early detection of moving clouds and connecting a data collecting and process module to read and process signal from the sensors. The cloud shadow sensors may include telemetry to send signals indicating intermittent irradiance changes caused by the incoming clouds. The cloud shadow sensors are ground based. The method of tracking cloud of claim can further include arranging the cloud shadow sensors in two concentric rings called outer detection perimeter and inner detection perimeter respectively. The distance of the outer detection perimeter from the photovoltaic power plant can be designed to assure efficient response and grid interoperability. The distance of the outer detection perimeter from the photovoltaic power plant can be a definable distance further than the inner detection perimeter that can facilitate cloud speed and trajectory determination. Additional concentric rings can be used to confirm trajectory. The spacing between ground sensors on the perimeters and the spacing between outer detection perimeter and inner detection perimeter can be designed to assure determination of the speed and trajectory of the incoming clouds. The sensors on the inner detection perimeter can be spaced closer than the sensors on the outer detection perimeter to better detect stray clouds not picked up at the outer detection perimeter. The distance of the detection perimeters from the photovoltaic power plant and the arrangement of ground sensors can be designed to assure determination of the anticipatory action needed to mitigate the effects of intermittent cloud shadows on the photovoltaic power plant.

The method of tracking cloud of claim can further include initiating ramp down of the photovoltaic plant output power by control of inverters when clouds are detected at the outer detection perimeter, determining the trajectory and speed at the inner detection perimeter by comparison to detection position and time elapsed at the outer detection perimeter, delaying the ramp down of the plant based on the speed calculated at the inner detection perimeter, and initiating ramp up of the photovoltaic plant output power by control of inverters when cloud shadows have cleared the photovoltaic plant array field and no other oncoming clouds are detected. Ramp down of the plant can occur within 5 minutes, or less, of detecting clouds at the outer detection perimeter. Ramp up of the plant can occur within 5 minutes, or less, of clouds clearing the photovoltaic array.

The cloud shadow sensors can be positioned in substantially the same plane of the photovoltaic plant array so that the magnitude of solar irradiance deviation can be detected and used to calculate the amount power control needed. The cloud shadow sensors can also include photodiodes having different photovoltaic characteristics from the photovoltaic power plant. The timing of power ramp down and ramp up is based on a pre-set ramp rate. The power ramp down can be delayed based on measured cloud speed between outer and inner detection perimeters. The method of tracking cloud of claim can further include adjusting the normal power level of the plant to reduce plant output variability by using the plant output power averaged over a rolling period of time. The data collecting and process module may include a data storage device to generate a seasonal cloud shadowing profile.

A photovoltaic device can include a transparent conductive oxide layer adjacent to a substrate and layers of semiconductor material. The layers of semiconductor material can include a bi-layer, which may include an n-type semiconductor window layer, and a p-type semiconductor absorber layer. The n-type window layer and the p-type absorber layer may be positioned in contact with one another to create an electric field. Photons can free electron-hole pairs upon making contact with the n-type window layer, sending electrons to the n side and holes to the p side. Electrons can flow back to the p side via an external current path. The resulting electron flow provides current, which combined with the resulting voltage from the electric field, creates power.

Solar energy plants under favorable weather and cloud conditions tend to be predictable in that energy production coincides with daily solar cycles, fairly close to daily peak demand profile. However, photovoltaic solar energy is subject to short term variability when cumulus clouds pass over the photovoltaic array, reducing or eliminating the direct component of solar radiation. Clouds can form where temperature and humidity induce condensation of water vapor into droplets. In some instances, local heating causes air to rise. As it rises, the cooling process that occurs results in condensation and cloud formation. In other instances, wind distributions and the thermal structure of atmospheric weather systems cause boundaries with abrupt temperature changes. At these boundaries, clouds form due to both temperature and pressure effects. Clouds can consist of dust particles, water molecules and a number of gas molecules. This collection of matter is much more condensed than usual gases and that is why clouds can significantly perturb irradiation in the atmosphere.

During cloud shadow passage, the photovoltaic array produces power from the diffuse component of solar radiation. Referring to FIG. 1, relatively fast changes in solar radiation can be possible, which will result in increased unpredictability of photovoltaic plant power output. These changes in solar radiation can occur during times of intermittent cloud cover. Intermittent cloud cover can include a change in the coverage of clouds caused by oncoming clouds approaching and/or passing over the photovoltaic array, or by outgoing clouds passing away from the photovoltaic array, or by clouds forming or disappearing over the photovoltaic array. These changes in cloud cover can cause changes in sun intensity and/or the irradiance which the photovoltaic array is exposed to. These changes can be rapid (occurring relatively quickly) and large (characterized by a large difference in cloud cover, and/or sun intensity, and/or irradiance over a defined period of time). A substantial change in solar irradiance due to the change in cloud cover can occur in less than 10 minutes, or less than 5 minutes, or less than 3 minutes, or less than 1 minute.

Figure 2:
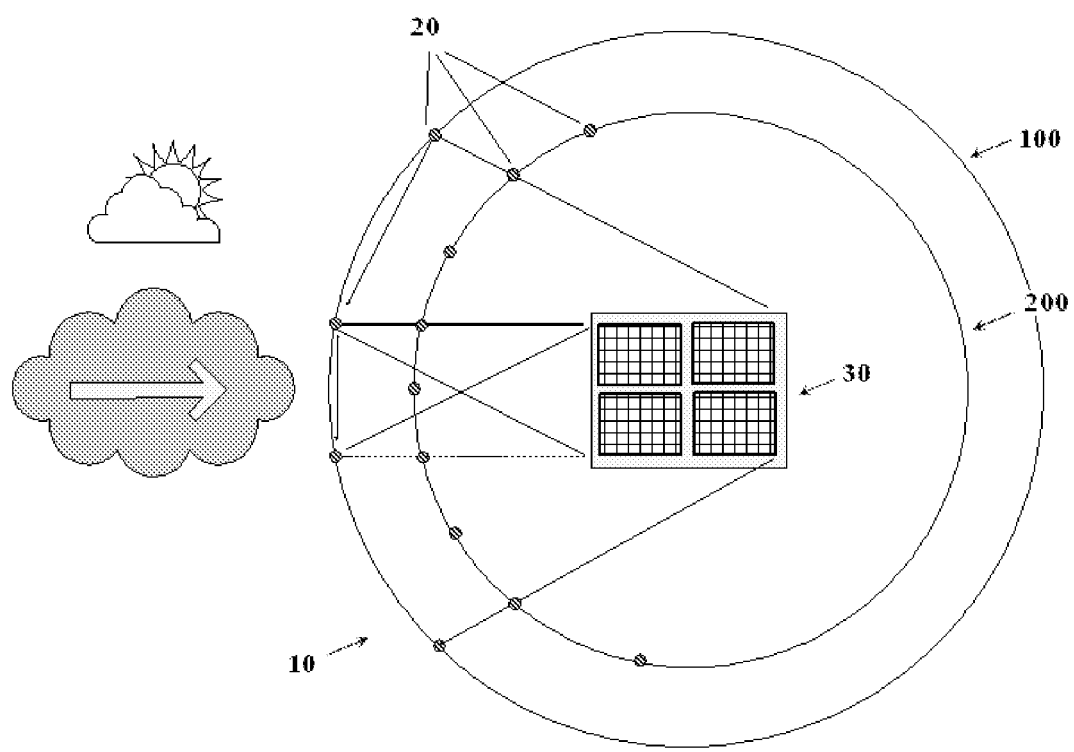
FIG. 2 is a schematic of a cloud tracking system for photovoltaic power plant having cloud shadow sensors arranged in two concentric rings.

Variability of photovoltaic power plants can be reduced by predicting and anticipating cloud cover. Referring to FIG. 2, the objective of the arrangement shown is to provide power level predictability and control of power ramp rates of a photovoltaic plant to assure efficient response and grid interoperability by all available grid generation resources. In one embodiment, a photovoltaic power plant can adjust its power ramp rate based on detected clouds of a detected speed and trajectory, and resulting cloud cover, or a detected change in cloud cover, in less than 10 minutes, less than 5 minutes, less than 3 minutes, or less than 1 minute.

The concept of cloud tracking system 10 is based on detection of moving cloud shadows with ground based cloud shadow sensors 20 that have telemetry to send signals indicating intermittent irradiance changes as well as wind speed and direction. Cloud shadow sensors 20 can be irradiance sensors or any other suitable sensor or detector for detecting the presence or absence of cloud cover at a position. Cloud shadow sensors 20 can be located outside of the perimeter of photovoltaic plant 30 at a distance that permits early detection of moving clouds, such as various species of cumulus. Wind speed and direction sensors can be located within the plant boundary.

In certain embodiments, cloud shadow sensors 20 can be arranged in two concentric rings called detection perimeters. For example, these can include the outer detection perimeter (ODP) 100 and the inner detection perimeter (IDP) 200. The distance of inner detection perimeter 200 from the photovoltaic plant is dependent on the maximum permissible ramp rate, the PV plant power deviation to be controlled, and the design speed of fair weather clouds for the particular plant location:

$$IDP = \alpha * MW_{PR} * V_{cl}/R$$

where:
α=Worst case per unit value of PV plant power deviation to be controlled based on Rated Plant Capacity
$MW_{PR}$=Rated Plant Capacity in MW;
$V_{cl}$=Design Cloud Speed;
R=Maximum Permissible Ramp Rate.

The Design Cloud Speed can be determined by local historical weather and cloud movement data. More than two concentric rings can be used to confirm trajectory.

If it is assumed that worst case power deviation due to cloud cover is 80% of the rated plant capacity, according to the short term solar variability shown in FIG. 1, then the maximum value of α would be 0.8. Depending upon application, the value of α may be varied to allow more or less controlled power deviation to optimize the arrangement of cloud shadow sensors 20 and the response of the plant to that particular location.

Once a well defined cloud shadow has been detected and trajectory toward the photovoltaic plant confirmed at inner detection perimeter 200, the plant control system initiates a control sequence to decrease plant output power at the predetermined ramp rate based on the cloud speed. Cloud speed and trajectory are determined by comparison of timing and location of the detected cloud between cloud shadow sensors 20 located on outer detection perimeter 100 and inner detection perimeter 200.

Outer detection perimeter 100 can be located further away from the array field of photovoltaic plant 30 than inner detection perimeter 200 by a definable distance. The distance between outer detection perimeter 100 and the inner detection perimeter 200 should be sufficient to permit detection of a reasonably massive and irregularly shaped cloud shadow and determine its trajectory. The distance between outer detection perimeter 100 and inner detection perimeter 200 is important to the accuracy of trajectory determination. Ideally, it would be best for a well defined cloud shadow to be detected and clear outer detection perimeter 100 before being detected by inner detection perimeter 200. To accomplish this, a typical cloud shadow is defined as a circle of diameter D. The distance between outer detection perimeter 100 and inner detection perimeter 200 must be greater than D. If cloud shadow sensors 20 at outer detection perimeter 100 and inner detection perimeter 200 indicate a cloud shadow of approximately equal size, the cloud shadow trajectory is assumed to be in the direction of the plant. A typical cloud shadow can be determined by local historical weather and cloud movement data.

The two detection perimeters can consist of multiple cloud shadow sensors 20 arranged as shown in FIG. 2. The spacing of cloud shadow sensors 20 around the perimeters must be less than the breadth of the plant as observed from the direction of cloud trajectories. The arrangement of cloud shadow sensors 20 around the perimeters and the spacing between outer detection perimeter 100 and inner detection perimeter 200 can be designed to determine the trajectory of the incoming clouds. The sensors located in inner detection perimeter 200 will be spaced closer to better detect stray clouds not picked up at outer detection perimeter 100.

The distance of the detection perimeters from photovoltaic plant 30, and arrangement of ground sensors can determine the anticipatory action needed to mitigate the effects of intermittent or sudden cloud shadows on photovoltaic plant 30. Cloud tracking system 10 can further include a plant control system. The plant control system can initiate ramp down of photovoltaic plant 30 output power by control of inverters when clouds are detected at inner detection perimeter 200.

Cloud detection will be confirmed and trajectory and speed determined at inner detection perimeter 200 by comparison to detection position and time elapsed at outer detection perimeter 100. The outer detection perimeter 100 is located further from power plant 30 than inner detection perimeter 200 to facilitate determination of cloud speed and trajectory. Additional detection perimeters can be arranged around photovoltaic power plant 30. For example, a third detection perimeter can be arranged around power plant 30. The placement of a third detection perimeter relative to outer detection perimeter 100, inner detection perimeter 200, and power plant 30 can be designed such that the third detection perimeter can cooperate with outer detection perimeter 100 and inner detection perimeter 200 to provide additional data for calculation of cloud trajectory.

Once cloud shadows have cleared the PV array field of photovoltaic plant 30 and no other oncoming clouds are detected, the plant control module will initiate power ramp up. The timing of power ramp down and ramp up is based on a pre-set ramp rate. Cloud shadow sensors 20 can be positioned in substantially the same plane of photovoltaic plant 30 array and can be mounted on the ground by any suitable mounting apparatus. In this way, the magnitude of global solar irradiance deviation can be detected and used by the control system to calculate the amount power control needed. The cloud shadow sensors 20 can also include photodiodes having different photovoltaic characteristics or properties than the photovoltaic modules used in photovoltaic power plant 30. These differences can include properties such as IV curve, light-intensity voltage output, or any other suitable photovoltaic properties. The differences between the photovoltaic characteristics or properties of the photovoltaic modules in photovoltaic power plant 30 and the photovoltaic characteristics or properties of cloud shadow sensors 20 can be sufficient to distinguish the cloud shadow sensors 20 from the photovoltaic modules. In other embodiments, the photovoltaic characteristics or properties of the photovoltaic modules in photovoltaic power plant 30 and the photovoltaic characteristics or properties of cloud shadow sensors 20 can be substantially similar.

Wind speed and direction can be incorporated into the algorithm for predicting cloud shadow speed and trajectory. Typically, wind speed near the ground is less than the speed at or greater than moderate heights (about 2000 feet Above Ground Level (AGL)) where low level boundary layer cumulus clouds form. Wind direction at moderate or greater heights is also not affected by ground friction and is generally 40 to 50 degrees different than ground level. Using this information, cloud shadow speed and trajectory can be estimated and used to confirm and anticipate the results of the prediction made using the sensors 20 located on outer detection perimeter 100 and inner detection perimeter 200. For example, high ground level wind speed detection greater than $V_{cl}$ in conjunction with wind direction sensing can be used to add anticipatory action and begin plant power reduction upon cloud shadow detection at the outer detection perimeter 100 instead of waiting for confirmation at the inner detection perimeter 200.

Cloud shadow sensors 20 can be a photodiode. A photodiode is a PN junction or PIN structure. When a photon of sufficient energy strikes the diode, it excites an electron, thereby creating a mobile electron and a positively charged electron hole. If the absorption occurs in the junction's depletion region, or one diffusion length away from it, these carriers are swept from the junction by the built-in field of the depletion region. Thus holes move toward the anode, and electrons toward the cathode, and a photocurrent is produced. When used in zero bias or photovoltaic mode, the flow of photocurrent out of the device is restricted and a voltage builds up. The diode becomes forward biased and "dark current" begins to flow across the junction in the direction opposite to the photocurrent. Cloud shadow sensors 20 can also include photodiodes having different photovoltaic characteristics than the photovoltaic power plant. As noted above, the differences between the photovoltaic characteristics or properties of the photovoltaic modules in photovoltaic power plant 30 and the photovoltaic characteristics or properties of cloud shadow sensors 20 can be sufficient to distinguish the cloud shadow sensors 20 from the photovoltaic modules.

The control algorithm for regulating the rate of change of output power shall be adaptive so that the plant output power averaged over a rolling period of time is used to adjust the normal power level of the plant. The basic principle is to reduce variability, reducing the normal plant output as variability increases and increase normal plant output as variability decreases. The result, ideally, is the plant produces a power output profile that is related to the average variability. Cloud tracking system 10 can also include a data collecting and process module or data storage device to generate seasonal cloud shadowing profile.

Cloud tracking system 10 can also be used as a tool in making weather predictions, evaluating climatic factors, or in any other suitable applications. For example, cloud tracking system 10 can be used to determine and report the distribution, amount, and trajectory of moving clouds in the vicinity of an airport or airfield for aircraft flight safety. The detection of cloudiness can also be achieved by several available techniques, but they are time consuming and often do not provide a function to track and predict the trajectory of moving clouds.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A cloud tracking system for a photovoltaic power plant comprising: a plurality of cloud shadow sensors arranged in at least two concentric rings called the outer detection perimeter and the inner detection perimeter positioned around the photovoltaic power plant,
   wherein the distance of the inner detection perimeter from the photovoltaic power plant is determined based at least in part on a rated capacity of the photovoltaic power plant, historical cloud speed data, and a maximum permissible ramp rate of the photovoltaic power plant, and
   a data collecting and process module configured to collect data from the sensors,
   wherein the outer detection perimeter and the inner detection perimeter are used in coordination to determine the direction and speed of cloud cover for ramp up and ramp down control of the photovoltaic array by comparing data gathered at the outer detection perimeter and the inner detection perimeter.

2. The cloud tracking system of claim 1, wherein the cloud shadow sensors comprise telemetry to send signals indicating intermittent irradiance changes caused by incoming clouds.

3. The cloud tracking system of claim 1, wherein the distance of the outer and inner detection perimeters from the photovoltaic power plant and the arrangement of the sensors are designed to assure time for photovoltaic plant control response, detection of cloud speed and trajectory, and grid interoperability.

4. The cloud tracking system of claim 1, wherein the outer detection perimeter is located a definable distance further than the inner detection perimeter, and the further distance of the outer detection perimeter from the photovoltaic power plant is designed to facilitate calculation of cloud speed and trajectory.

5. The cloud tracking system of claim 4, wherein said plurality of cloud sensors are further arranged in a third concentric ring which defines a third detection perimeter, the third detection perimeter cooperating with the outer detection perimeter and the inner detection perimeter to provide additional data for the calculation of cloud trajectory.

6. The cloud tracking system of claim 1, wherein the sensors on the inner detection perimeter are spaced closer than the sensors on the outer detection perimeter to better detect stray clouds not picked up at the outer detection perimeter.

7. The cloud tracking system of claim 1, wherein the distance of the detection perimeters from the photovoltaic power plant and the arrangement of ground sensors are designed to assure determination of the anticipatory action needed to mitigate the effects of intermittent cloud shadows on the photovoltaic power plant.

8. The cloud tracking system of claim 1 further comprising a power plant control system, wherein the control system can initiate ramp down of the photovoltaic plant output power by control of inverters when clouds are detected at the outer detection perimeter, wherein the plant control system can initiate the start of the ramp down process based on the speed detected at the inner detection perimeter and the plant control system can initiate power ramp up when cloud shadows have cleared the photovoltaic plant array field and no other oncoming clouds are detected.

9. The cloud tracking system of claim 8, wherein the cloud shadow sensors are positioned in substantially the same plane of the photovoltaic plant array so that the magnitude of solar irradiance deviation can be detected and used by the control system to calculate the amount of power control needed.

10. The cloud tracking system of claim 8, wherein the timing of power ramp down and ramp up can be based on a pre-set ramp rate, wherein the initiation of the power ramp down can be delayed based on the measured cloud speed between the outer and inner detection perimeters.

11. The cloud tracking system of claim 8, wherein the power plant control module comprises an adaptive control algorithm for regulating the rate of change of output power so that the plant output power averaged over a rolling period of time is used to adjust the normal power level of the plant to reduce plant output variability.

12. The cloud tracking system of claim 1, wherein the data collecting and process module comprises a data storage device to generate a seasonal cloud shadowing profile.

13. The system of claim 1, wherein the distance of the inner detection perimeter from the power plant is determined by:

$$IDP = \Delta * MW_{PR} * V_{cf}/R,$$

wherein IDP is the distance of the inner detection perimeter from the photovoltaic plant, $\Delta$ is a worst case per unit value of the photovoltaic power plant deviation to be controlled based on the rated plant capacity, $MW_{PR}$ is the rated plant capacity in megawatts, $V_{cf}$ is a design cloud speed that is based on historical weather and cloud movement data, and R is a maximum permissible ramp rate of the photovoltaic power plant.

14. A method of tracking a cloud for a photovoltaic power plant comprising:

positioning a plurality of cloud shadow sensors in two concentric rings called an outer detection perimeter and an inner detection perimeter around the photovoltaic power plant, wherein the inner detection perimeter is positioned at a distance from the photovoltaic power plant that is determined based at least in part on a rated capacity of the photovoltaic power plant, historical cloud speed data, and a maximum permissible ramp rate of the photovoltaic power plant; and collecting and processing signals from the sensors, wherein the outer detection perimeter and the inner detection perimeter are used in coordination to determine the direction and speed of cloud cover for ramp up and ramp down control of the photovoltaic array by comparing data gathered at the outer detection perimeter and the inner detection perimeter.

15. The method of claim 14, wherein the cloud shadow sensors comprise telemetry to send signals indicating intermittent irradiance changes caused by the incoming clouds.

16. The method of claim 14, further comprising the step of positioning a plurality of cloud shadow sensors in a third concentric ring comprising a third detection perimeter designed to cooperate with the outer detection perimeter and the inner detection perimeter to provide additional data for calculation of cloud trajectory.

17. The method of claim 14 further comprising
initiating ramp down of the photovoltaic plant output power by control of inverters when clouds are detected at the outer detection perimeter;
and
initiating ramp up of the photovoltaic plant output power by control of inverters when the clouds have cleared the photovoltaic plant array field and no other oncoming clouds are detected.

18. The method of claim 17, wherein ramp down of the plant occurs within 5 minutes of detecting clouds at the outer detection perimeter.

19. The method of claim 17, wherein ramp up of the plant occurs within 5 minutes of clouds clearing the photovoltaic array.

20. The method of claim 17, wherein ramp down of the plant is delayed based on the speed of a cloud calculated at the inner detection perimeter.

21. The method of claim 17, wherein the cloud shadow sensors have the same photovoltaic characteristics of the photovoltaic power plant array and are positioned in substantially the same plane of the photovoltaic plant array so that the magnitude of solar irradiance deviation can be detected and used to calculate the amount of power control needed.

22. The method of claim 17, wherein the timing of power ramp down and ramp up is based on a pre-set ramp rate.

23. The method of claim 22, wherein the power ramp down can be delayed based on a cloud speed measured between the outer detection perimeter and the inner detection perimeters.

24. The method of claim 17 further comprising adjusting the power level of the plant to reduce plant output variability by using the plant output power averaged over a rolling period of time.

25. The method of claim 14, wherein the inner detection perimeter is positioned at a distance from the power plant determined by:

$$IDP = \Delta * MW_{PR} * V_{cl}/R,$$

wherein IDP is the distance of the inner detection perimeter from the photovoltaic plant, $\Delta$ is a worst case per unit value of the photovoltaic power plant deviation to be controlled based on the rated plant capacity, $MW_{PR}$ is the rated plant capacity in megawatts, $V_{cl}$ is a design cloud speed that is based on historical weather and cloud movement data, and R is a maximum permissible ramp rate of the photovoltaic power plant.

* * * * *